United States Patent
Park et al.

(10) Patent No.: US 10,147,765 B2
(45) Date of Patent: Dec. 4, 2018

(54) TEST STRUCTURES FOR MANUFACTURING PROCESS OF ORGANIC PHOTO DIODE IMAGING ARRAY

(71) Applicant: dpiX, LLC, Colorado Springs, CO (US)

(72) Inventors: Byung-Kyu Park, Colorado Springs, CO (US); Edward Myers, Colorado Springs, CO (US); Ick-Hwan Ko, Colorado Springs, CO (US); Karthik Nagarajan, Colorado Springs, CO (US); Shawn Michael O'Rourke, Colorado Springs, CO (US)

(73) Assignee: DPIX, LLC, Colorado Springs, CO (US)

( * ) Notice: Subject to any disclaimer, the term of this patent is extended or adjusted under 35 U.S.C. 154(b) by 0 days.

(21) Appl. No.: 15/381,679

(22) Filed: Dec. 16, 2016

(65) Prior Publication Data
US 2017/0179200 A1  Jun. 22, 2017

Related U.S. Application Data

(60) Provisional application No. 62/387,000, filed on Dec. 18, 2015.

(51) Int. Cl.
| | |
|---|---|
| *G01R 31/26* | (2014.01) |
| *H01L 21/66* | (2006.01) |
| *H01L 27/30* | (2006.01) |
| *H01L 51/00* | (2006.01) |

(52) U.S. Cl.
CPC ........ *H01L 27/307* (2013.01); *G01R 31/2635* (2013.01); *H01L 22/32* (2013.01); *H01L 51/0031* (2013.01); *H01L 22/34* (2013.01)

(58) Field of Classification Search
CPC ....... H01L 27/307; H01L 22/32; H01L 22/34; G01R 31/2635
USPC ..................... 257/40, 48, E23.015
See application file for complete search history.

(56) References Cited

U.S. PATENT DOCUMENTS

| | | | | |
|---|---|---|---|---|
| 6,636,064 B1* | 10/2003 | Satya | ..... | G01N 21/66 324/750.3 |
| 7,030,633 B1* | 4/2006 | Qiu | ..... | G01N 27/045 257/E21.531 |
| 2010/0032659 A1* | 2/2010 | Yoshida | ..... | H01L 27/14603 257/40 |

* cited by examiner

*Primary Examiner* — Robert T Huber
(74) *Attorney, Agent, or Firm* — Slater Matsil, LLP

(57) ABSTRACT

A test structure for characterizing an organic photodiode image sensor includes, on a common substrate, a cathode sheet resistance portion; a diode capacitance portion; an organic photodiode sheet resistance portion; a contact resistance portion; a step coverage portion; a quantum efficiency portion; a film adhesion portion; and an inkjet printing portion. The organic photodiode sheet resistance portion includes gate metal sets, each gate metal set including four evenly spaced metal lines terminating in a probe point, wherein the spacing within each gate metal set is progressively increased from a first gate metal set to a last gate metal set, and wherein a spacing between each gate metal set is larger than the spacing within any gate metal set; and an organic photodiode sheet formed over the gate metal sets.

23 Claims, 21 Drawing Sheets

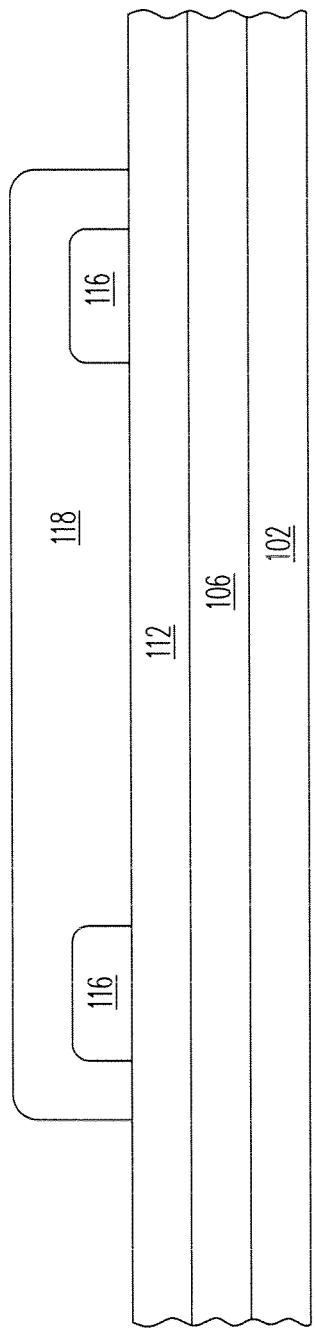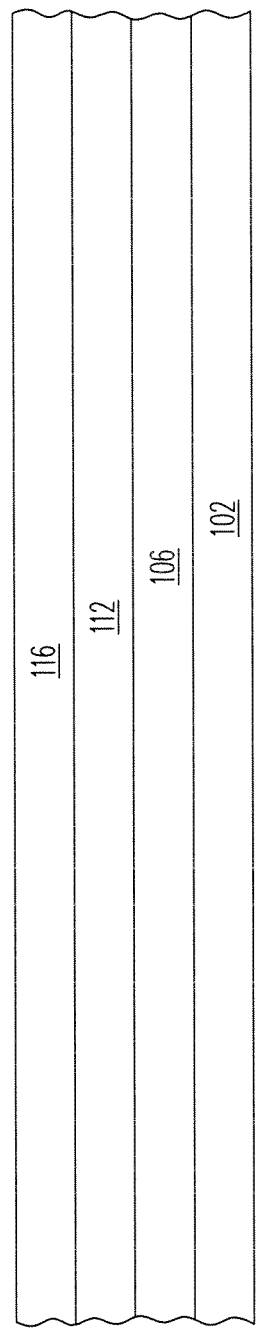

TEST STRUCTURES FOR MANUFACTURING PROCESS OF ORGANIC PHOTO DIODE IMAGING ARRAY

RELATED APPLICATIONS

The present application relates to and claims priority of U.S. provisional patent application ("Provisional Application"), Ser. No. 62/387,000, filed on Dec. 18, 2015. The disclosure of the Provisional Application is hereby incorporated by reference in its entirety.

BACKGROUND OF THE INVENTION

1. Field of the Invention

The present invention generally relates to image sensor devices, and, more particularly, to a method for manufacturing the image sensor devices.

2. Relevant Background

Image sensor devices are known in the art. A subset of image sensor devices can be used as a flat panel imager for use in X-ray imaging (digital radiography). Increasingly, organic materials are being considered for use in the photodiodes of these types of image sensor devices. While organic materials provide performance and cost advantages, the image sensors made with these materials must be comprehensively tested using test structures. What is desired is a set of test structures that are designed to fully validate an Organic Photodiode (OPD) process and also to measure and collect electrical data that would help to improve image sensor designs and products with respect to performance, reliability, uniformity, and light sensitivity.

SUMMARY OF THE INVENTION

A test structure for characterizing an organic photodiode image sensor according to an embodiment of the present invention includes, on a common substrate, at least one of: a cathode sheet resistance portion; a diode capacitance portion; an OPD sheet resistance portion; a contact resistance portion; a step coverage portion; a quantum efficiency portion; a film adhesion portion; and an inkjet printing portion. The cathode sheet resistance portion includes a plurality of TM (Top Metal) metal sets, each set including four evenly spaced TM metal lines terminating in a probe point, and wherein the spacing for each TM metal set is progressively increased from a first TM metal set to a last TM metal set; and a cathode sheet formed over the plurality of TM metal sets. The diode capacitance portion includes a bottom electrode coupled to a probe point; an OPD layer over the bottom electrode; and a top electrode coupled to a probe point. The OPD sheet resistance portion includes a plurality of TM metal sets, each set including four evenly spaced TM metal lines terminating in a probe point, and wherein the spacing for each TM metal set is progressively increased from a first TM metal set to a last gate metal set; and an OPD sheet formed over the plurality of TM metal sets. The contact resistance portion can include a plurality of paired sub-test structures having a plurality of different bank layer openings for measuring OPD layer coverage therein. The contact resistance portion can include a plurality of paired sub-test structures having a plurality of different bank layer openings for measuring cathode layer coverage therein. The step coverage portion can include a segmented top metal layer and a segmented bank layer, covered with a continuous OPD layer and a continuous cathode layer. The step coverage portion can include a segmented top metal layer and a segmented bank layer, covered with a continuous OPD layer. The quantum efficiency portion includes a reference capacitor portion and an OPD photodiode portion. The film adhesion portion comprises a plurality of overlapping image sensor layers, including an OPD layer to glass substrate adhesion portion; an OPD layer to top metal layer adhesion portion; a bank layer to top metal layer adhesion portion; an OPD layer to bank layer adhesion portion; an OPD layer to ILD layer adhesion portion; a bank layer to ILD layer adhesion portion; a cathode layer to ILD layer adhesion portion; a cathode layer to top metal layer adhesion portion; and a cathode layer to OPD layer adhesion portion. The inkjet printing portion includes a continuous top metal layer over a segmented gate metal layer. The test structure is integrated on the common substrate as a standalone test structure, or can be integrated on the common substrate with a photodiode array.

The image sensor device and method of manufacturing is fully described below with various embodiments and examples, and is illustrated in the following drawings.

BRIEF DESCRIPTION OF THE DRAWINGS

FIGS. 13A through 13K illustrate, in plan and cross-sectional views, a film adhesion test structure according to the present invention;

DETAILED DESCRIPTION OF THE PREFERRED EMBODIMENTS

With the test structures of the present invention, it is possible to measure electrical parameters including sheet resistance, photodiode capacitance, contact between the OPD layer and the top metal layer, quantum efficiency and to also measure process parameters including step coverage and adhesion of different metal layers over one another. Measuring these parameters and accumulating historical data of these parameters helps to improve manufacturing techniques and product performance by comparing new technologies with currently used technologies.

Figure 1:
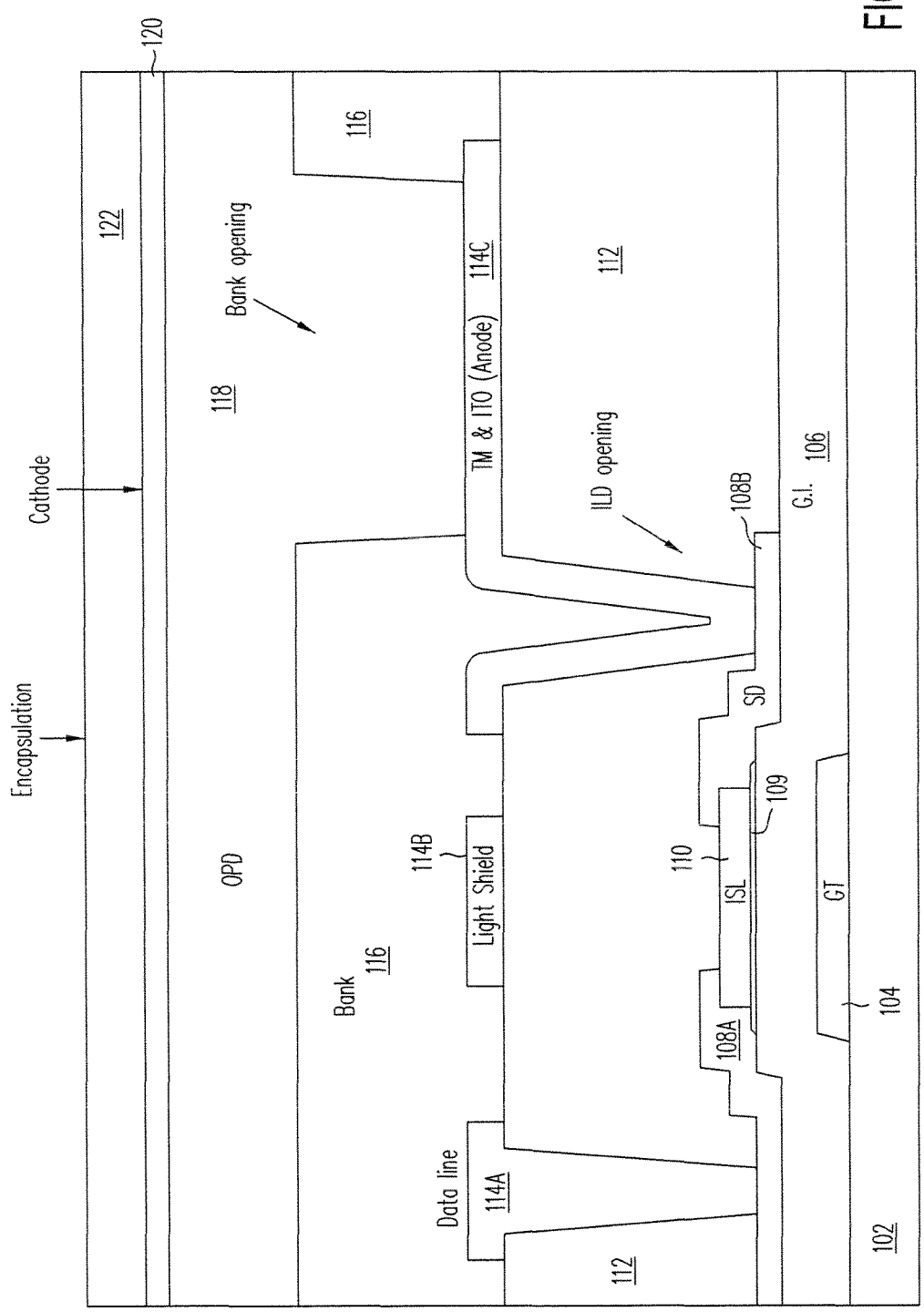
FIG. 1 illustrates, in a cross-sectional view, a portion of an image sensor array including an organic photodiode according to the present invention.

FIG. 1 illustrates, in a cross-sectional view, a portion of an image sensor array including an organic photodiode ("Photo Diode") and a corresponding pixel circuit transistor ("TFT") according to the present invention.

Layer 102 is a glass or plastic substrate. Other flexible or non-flexible materials could also be used.

Layer 104 is, for example, an aluminum patterned gate metal ("GT"). However, other metals can be used including Mo/Al/Mo, Ti/Al/Ti, TiW/Al, as well as other single metal layers or stacked combinations of metal layers.

Layer 106 is a gate insulating layer ("G.I.").

Layer 108 is the metal layer for the data line 108A and the intermediate contact line 108B. The left part (drain) of the line 108A is connected to a data line and the right part (source) of the line 108B is connected to the Anode metal as is explained in further detail below and designated "SD" in FIG. 1. Layer portion 108B is thus the interconnect inside the pixel circuit shown in FIG. 1.

Layer 109 is the semiconductor layer for the TFT transistor.

Layer 110 ("ISL") is an island/etch stopper layer that protects the semiconductor layer 109 underneath. The semiconductor layer 109 is located between G.I. layer 106 and the ISL layer 110, and that is why the ISL layer 110 is shown slightly above the G.I. layer 108 in FIG. 1.

Layer 112 is an inter-layer dielectric layer, which can be formed of SiOx, SiON, or SiNx material.

Layer 114 is a top metal layer including portions 114A ("Data Line"), 114B ("Light Shield") and 114C ("TM and ITO (Anode)"). TM and ITO refer to "top metal" and "Indium Tin Oxide", respectively. Top metal layer portion 114B is called the light shield and protects the TFT transistor from the impinging light.

Layer 116 is referred to as the bank layer. Bank layer 116 can be fabricated of an organic insulator material such as BCB (BenzoCycloButane) and includes a via to create the organic photodiode as is described in further detail below.

Layer 118 is the light sensitive OPD layer and can be fabricated with solution processed organic photodiode materials.

Layer 120 is the cathode metal layer, which can be formed of aluminum metal.

On top of cathode 120, there is an encapsulation layer 122, which acts as a passivation for the image sensor array. Encapsulation layer 122 can be formed of a combination of organic and inorganic materials.

In the following description, some of the test structures include OPD or cathode layers in two similar test structures. Generally speaking these test structures can substitute the OPD, cathode, or OPD/cathode layers. The distinct OPD and cathode layer test structures are generally described, but the OPD/cathode test structure is not always specifically described.

The cathode sheet resistance test structures according to the present invention are shown in FIGS. 2A, 2B, 3 and 4.

Figure 2A:
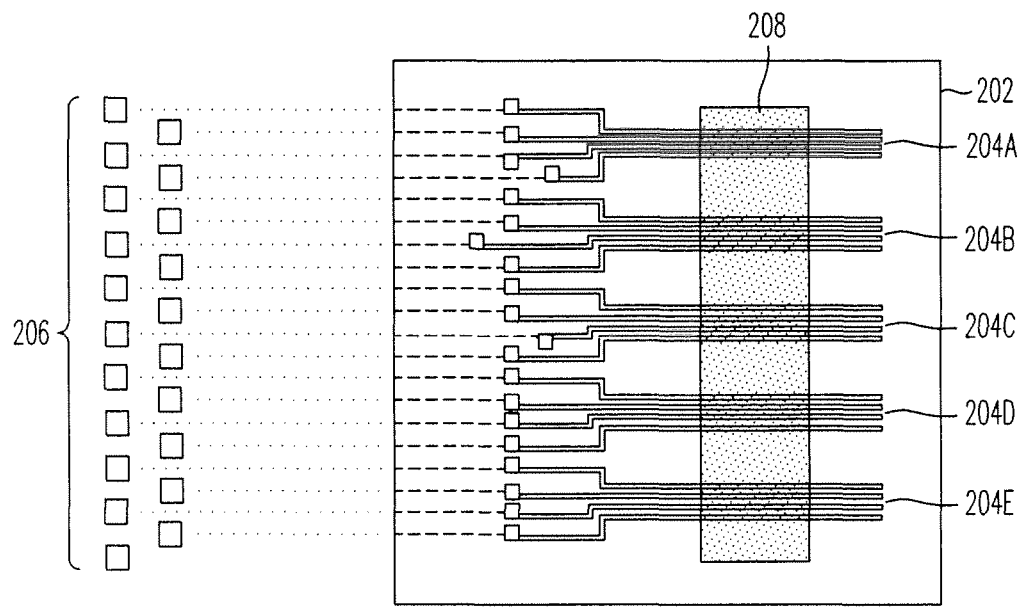
FIGS. 2A, 2B, and 3-4 illustrate, in plan and cross-sectional views, cathode sheet resistance test structures according to the present invention.

In FIG. 2A, layer 202 is formed using the cathode layer, which was previously described as layer 120 in FIG. 1. Thus, the structure shown in FIGS. 2A and 2B is used to measure the sheet resistance of cathode.

Figure 2B:
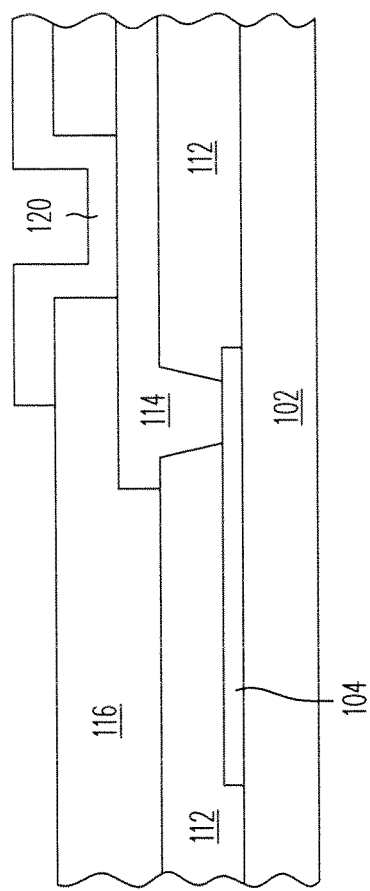
Figure 17:
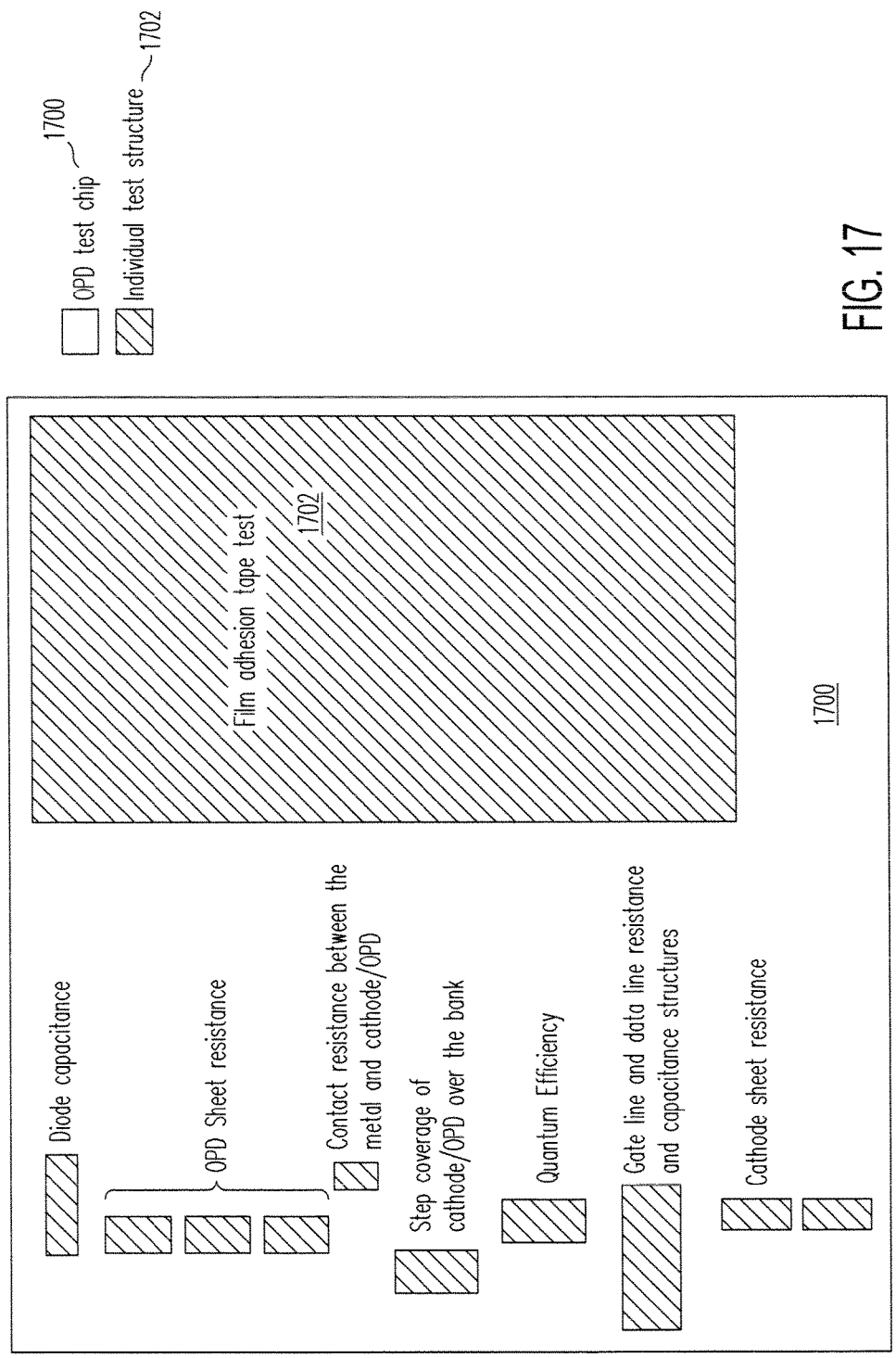
FIG. 17 illustrates a plan view of an OPD test chip including a layout of individual test structures according to the present invention.
Figure 18:
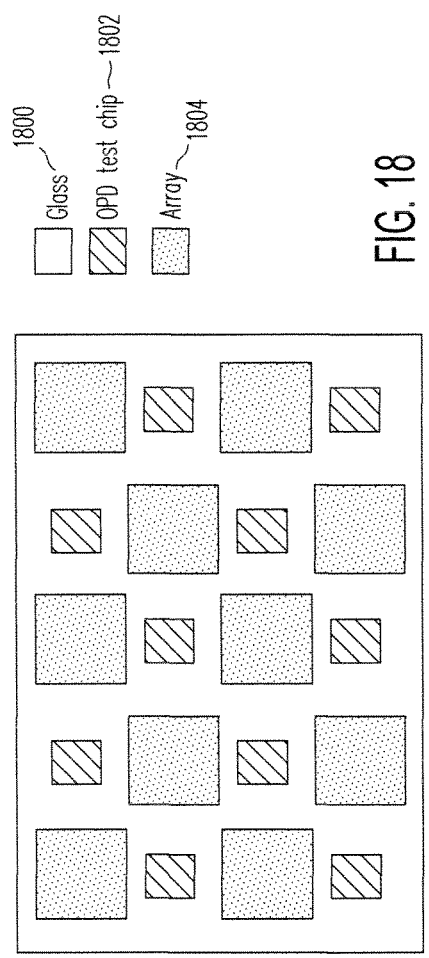
FIG. 18 illustrates a plan view of a first embodiment of an OPD test chip according to the present invention including a plurality of individual OPD test chips and a plurality of photodiode arrays.
Figure 19:
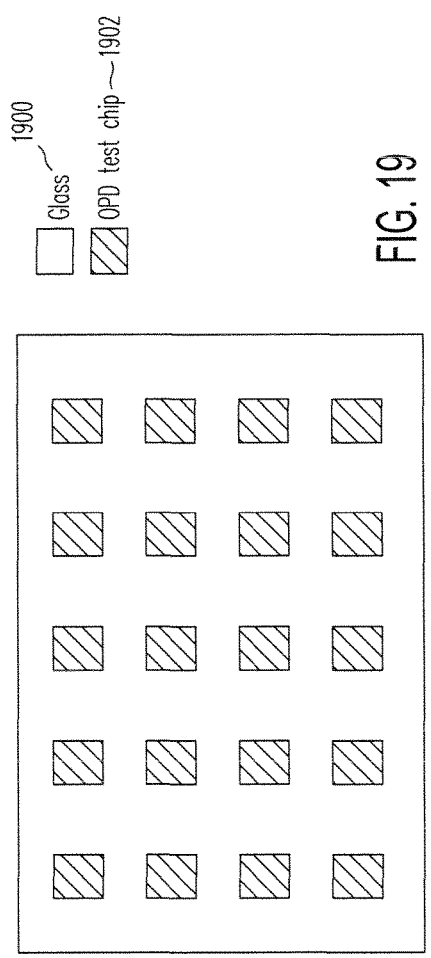
FIG. 19 illustrates a plan view of a second embodiment of an OPD test chip according to the present invention including only a plurality of individual OPD test chips.

The test structure shown in FIGS. 2A and 2B is ideally fabricated in combination with a production image sensor. But the test structure can be also be fabricated as a standalone test structure for research and development purposes as is shown in FIGS. 17, 18, and 19 and described in further detail below.

Metal structures 204A, 204B, 204C, 204D, and 204E are formed using the TM/ITO metal previously described. Features 206 are test pads Since the sheet resistance of the cathode is being measured, the metal layer 204A-204E structures are formed of TM/ITO since these layers are patterned at a higher level in the metal stack, as is shown in FIG. 1. The gate metal is used for routing the test patterns to the test pads. Layer 202 is the cathode as was previously described. The substrate is glass, which is transparent and is not actually shown in FIG. 2A. The substrate is therefore not shown in FIG. 2A or any of the plan view drawings other than the cross-sectional drawings. Layer 208 is an opening in the bank layer, such that the TM/ITO metal layer can actually contact the cathode layer.

The test structure of FIG. 2A thus comprises a metal pattern underneath a cathode layer, and is used as a means of measuring the sheet resistance of the cathode layer. Sheet resistance is typically measured using a four point probe, mainly to avoid contact resistance which can be the same magnitude as sheet resistance. A current is applied at the outer two probes, while the inner two probes are used to measure the voltage. From there, the sheet resistance can be calculated. The sheet resistance is often used to characterize the material. Resistance is affected by the material's resistivity as well as the length and width of the sheet. The cathode is typically a very thin metal layer that is typically several tens Angstroms or thinner. Because of the thin cathode, the sheet resistance measurement is not reliable with a top contact. The metal pattern beneath the cathode provides a bottom contact for probing as is best seen in FIG. 2B, which will be described in further detail below.

FIG. 2A thus shows the overall test structure for the cathode sheet resistance according to the present invention, including cathode layer 202, TM/ITO metal features 204A, 204B, 204C, 204D, and 204E, bank layer opening 208, and test pads 206 coupled to the test structure via gate metal features.

A cross-sectional view through the test structure shown in FIG. 2A is shown in FIG. 2B. The identification numerals, as in all of the subsequent cross-sectional views, are the same as is shown in the cross-sectional view of the image array section shown in FIG. 1 for ease of identifying the individual layers. In the view of FIG. 2B, the substrate layer 102 is shown, as well as the gate metal layer 104, and the ILD layer 112, including a via for allowing contact with the TM metal layer 114. Also shown in FIG. 2B is the bank layer 116. including the opening that allows the cathode layer 120 to contact the TM metal layer 114. It is important to note that this is only one slice through the test structure of FIG. 2A, and thus the resistive path through the test structure involves at least two lines (two cross-sectional views) and the cathode layer extends in a dimension extending out from FIG. 2B to complete the circuit.

Figure 3:
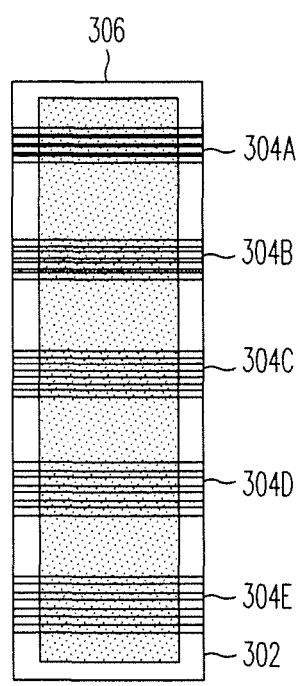

FIG. 3 shows a detail of the part of the test structure where the sheet resistance is found. Layer 302 is the cathode layer, metal features 304A, 304B, 304C, 304D, and 304E are the TM/ITO metal features, and layer 306 is the bank layer opening.

Figure 4:
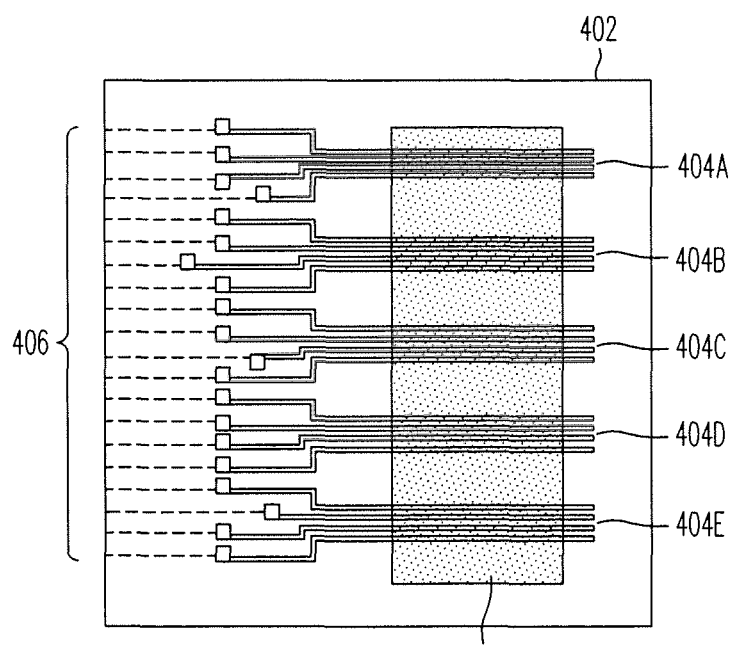

FIG. 4 is similar to FIGS. 2A and 2B, but with a larger Bank opening 408. The cathode layer 402, metal features 404A, 404B, 404C. 404D, and 404E, and contact pads 406, as well as the bank layer opening 408 are shown in FIG. 4.

To recap, the test structure, as seen for example in FIGS. 2A and 2B, includes four gate metal (base metal) lines attached to four probing points on the left side of the structure. The gate lines then connect with top metal lines at four contacts. The top metal lines then converge closer together and are evenly spaced. The cathode is then laid over the top metal lines. There are five sets of these four top metal lines, with each set having a larger separation between the top metal lines. The first set of lines are spaced 10 um apart, the second set of lines is spaced 15 um apart, the third set of lines are spaced 20 um apart, the fourth set of lines is spaced 25 um apart, and the final set of lines is spaced 30 um apart. The different spacings account for any kind of step coverage loss. The top metal lines spaced closer together may not have as good a step coverage as the lines spread out further apart. Because of this, resistance might increase between each top metal line. As previously explained, the sets in FIG. 4 have the same distance as those as shown in FIGS. 2A and 2B, but the Bank opening/cathode area is larger. The cathode area in FIGS. 2A and 2B is 440×1809.25 um, while the cathode area in FIG. 4 is 880×1809.25 um. Since sheet resistance depends on the area of the sheet, the two different sizes show how much the sheet resistance changes with the larger area. Using the probing points on the left side of the structure, the sheet resistance can then be calculated for each of the five sets of metal feature patterns.

Figure 5C:
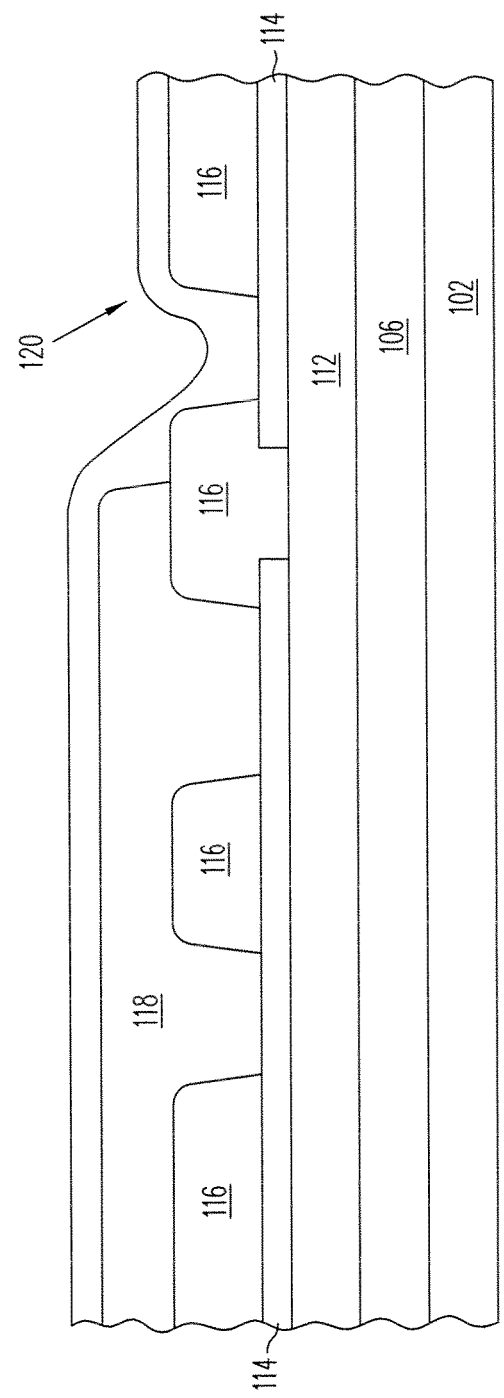
FIGS. 5A, 5B, and 5C illustrate, in a plan and cross-sectional views, a diode capacitance test structure according to the present invention.
Figure 5A:
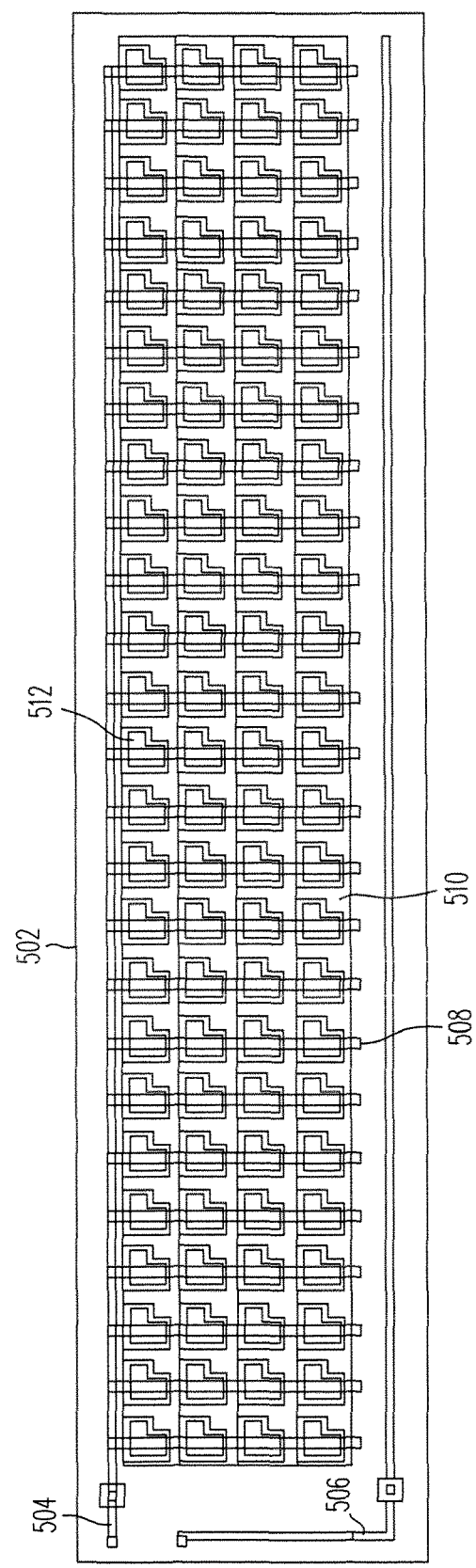
Figure 5B:
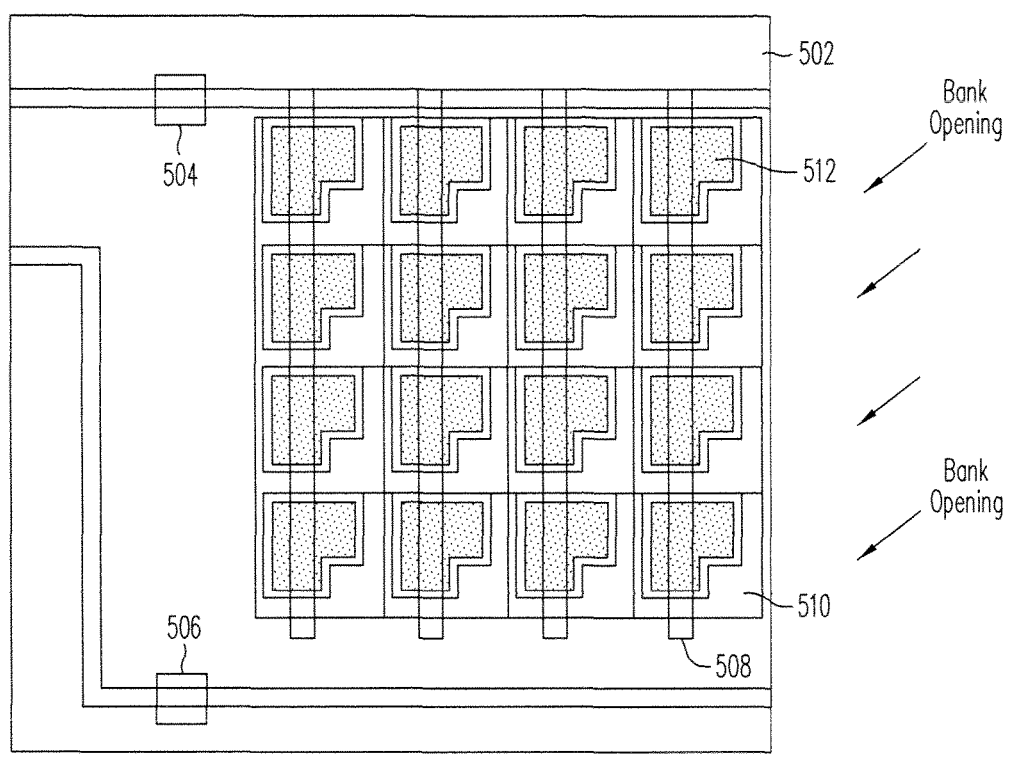

The diode capacitance test structure according to the present invention is shown in FIGS. 5A, 5B, and 5C.

With respect to the plan views of FIGS. 5A and 5B, layer 502 is the cathode layer. Layer 502 is the top layer in the stack shown in FIGS. 5A and 5B.

Layer 504 is the TM/ITO layer. All the TM/ITO features form the bottom electrode in the diode and are connected or shorted together and forms one of the two terminals used to measure the diode capacitance. From FIG. 5A it can be seen that all of the TM/ITO metal features are connected together and routed to the test pad using gate metal, which is connected to TM/ITO through a via. This is done to avoid or minimize additional overlap capacitance in measurement.

Layer 506 is the top electrode (cathode layer) of the diode. Layer 506 is hooked up to the test structure though the cathode layer.

Layer 508 is all of the TM/ITO lines connected together to form the bottom electrode.

Layer 510 shows the OPD layer being filled through the bank opening.

Layer 512 is the bottom electrode, which uses the TM/ITO metal layer as previously discussed. The shape of layer 512 is a plurality polygons.

This diode test structure shown in FIGS. 5A and 5B is made up of several photodiodes under a cathode layer in order to determine the photodiode capacitance. In this design, the top metal layer acts as the bottom electrode of the photodiodes while the cathode layer acts as the top electrode of the photodiodes. These are separated by an organic dielectric material. Typically any object that can be electrically charged has a capacitance and is represented as two parallel plates. Capacitance is a ratio of the area that the two plates overlap to the distance between the two plates. For parallel plates, the capacitance is found using the following equation: $C = \epsilon_r \epsilon_0 A/d$, where $\epsilon_r$ is the dielectric constant and $\epsilon_0$ is the electric constant ($8.854 \times 10^{-12}$ F/m).

FIGS. 5A and 5B are thus the design for the diode capacitance test structure as previously described.

The test structure consists of four rows of 25 polygons made of the top metal. A layer of the organic dielectric is then laid on top of the top metal followed by the cathode on top of the dielectric. The plates are charged using a gate metal line that, through a contact, become a top metal line that connects to each of the top metal polygons.

The diode capacitance test structure is perhaps better understood with reference to the cross-sectional view of the test structure shown in FIG. 5C. The cross-sectional view of FIG. 5C includes a glass or other substrate 102, a gate insulating layer 106, an ILD layer 112, and a segmented TM/ITO layer 114. The segmentation of the TM/ITO layer 114 creates the bottom electrode of the capacitor. A segmented bank layer is deposited on top of the TM/ITO layer 114 corresponding to the segmented features shown in the plan view drawings FIGS. 5A and 5B. An OPD layer is formed in a first portion of the test structure, and a continuous cathode layer 120 covers the entire test structure.

Figure 6A:
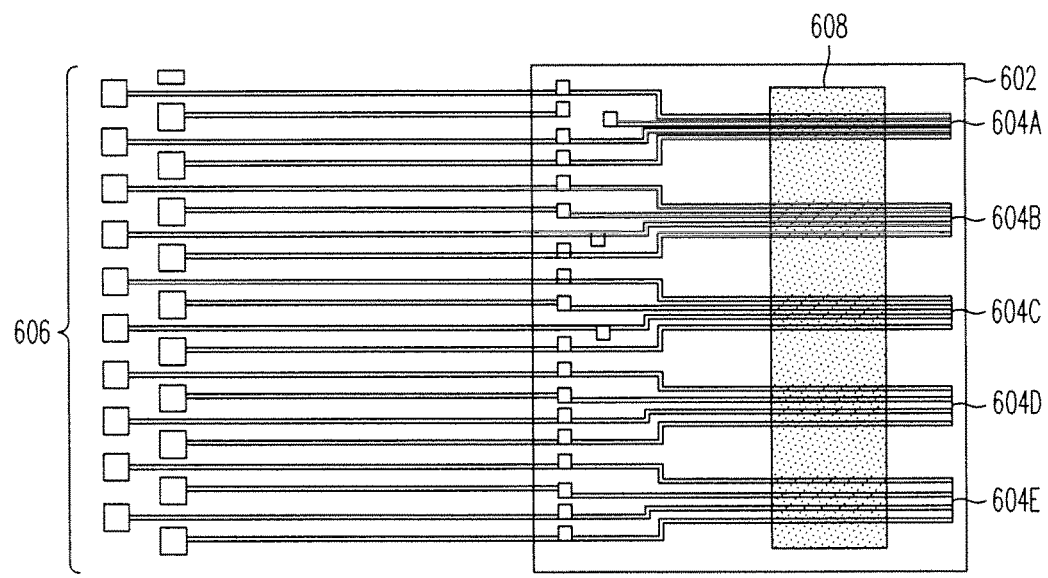
FIGS. 6A. 6B, and 7 illustrate, in plan and cross-sectional views, OPD sheet resistance test structures according to the present invention.
Figure 6B:
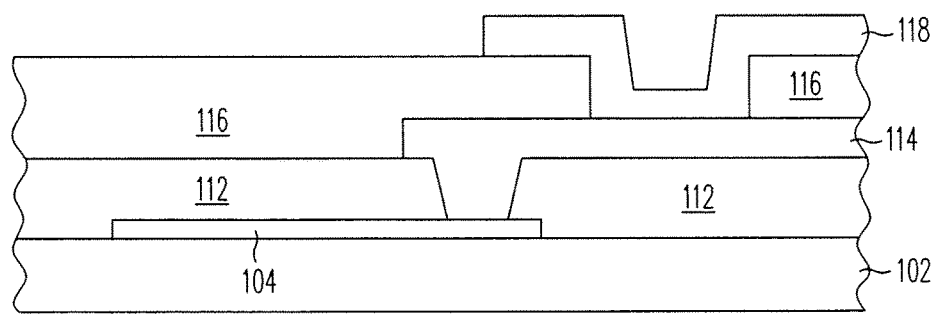
Figures 7, 8A:
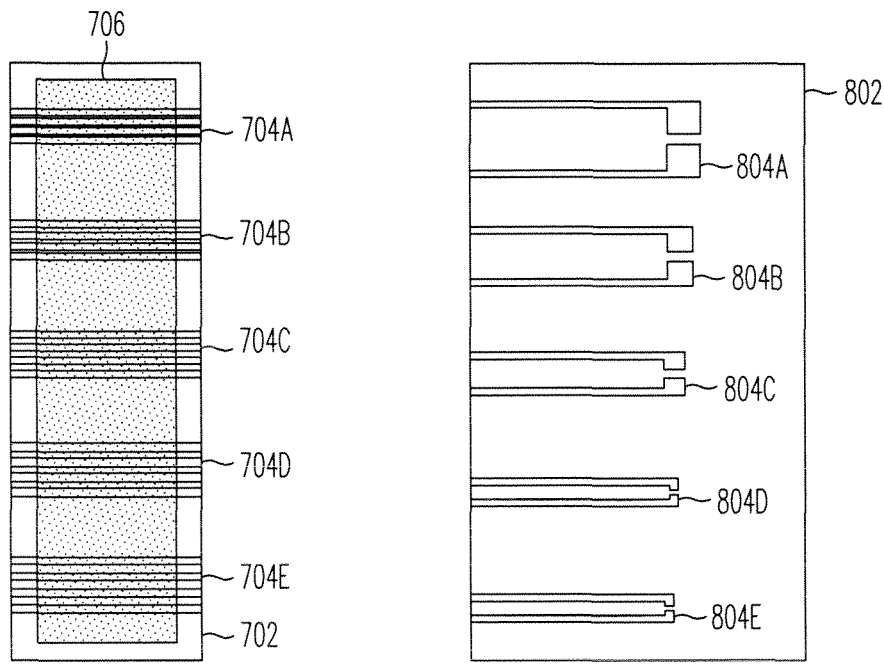
FIGS. 8A, 8B, 9A, and 9B illustrate, in plan and cross-sectional views, contact resistance test structures according to the present invention.

The OPD sheet resistance is measured with respect to the test structures shown in FIGS. 6A, 6B, and 7.

The OPD sheet resistance test structures shown in FIGS. 6A, 6B, and 7 are substantially the same as those shown in FIGS. 2A, 2B, 3, and 4 for measuring the sheet resistance of the cathode layer. The only substantial difference is the presence of OPD layer instead of the cathode layer in these structures.

Thus, in FIG. 6A, layer 602 is the OPD layer, metal features 604A, 604B, 604C, 604D, and 604E are the TM/ITO metal features, and 608 is the bank opening. Contact pads 606 are also shown in FIG. 6A.

The structure shown in FIGS. 6A and 6B comprises a metal pattern underneath a cathode and OPD (organic photodiode) layer, and is used as a means of measuring the OPD sheet resistance. Sheet resistance is typically measured using a four point probe, mainly to avoid contact resistance which can be the same magnitude as sheet resistance. A current is applied at the outer two probes, while the inner two probes are used to measure the voltage. From there, the sheet resistance can be calculated. The sheet resistance is often used to characterize the material. The OPD layer is about several thousand Angstroms to several microns thick. The metal pattern beneath the OPD layer provides bottom contact for probing.

FIG. 6A thus shows the plan view of the overall test structure for the OPD sheet resistance measurement.

FIG. 6B is a cross-sectional view of the OPD sheet resistance measurement and is substantially the same as FIG. 2B. Note, however, the presence of the OPD layer 118 instead of the previously shown cathode layer as the topmost layer in the structure.

FIG. 7 shows the part of the test structure where the sheet resistance is found, including OPD layer 702, metal features 704A, 704B, 704C, 704D, and 704E, and the bank layer opening 706.

The test structure, as seen in FIGS. 6A and 6B, comprises four gate metal (base metal) lines attached to four probing points on the left side of the structure. The gate lines then connect with top metal lines at four contacts. The top metal lines then converge closer together and are evenly spaced. An organic dielectric material is laid on top of the top metal, followed by the cathode and OPD layer. There are five sets of these four top metal lines with each set having a larger separation between the top metal lines. The different spacings account for any kind of step coverage loss. The top metal lines closer together may not have as good a step coverage as the lines spread out further apart. Because of this, resistance might increase between each top metal line. Using the probing points on the left side of the structure, the sheet resistance can then be calculated for each of the five sets of metal features.

FIG. 8A is the plan view of the test structure for measuring TM to OPD contact resistance. The only features shown in FIG. 8A are the OPD layer 802, and the TM/ITO features 804A, 804B, 804C, 804D, and 804E. The TM/ITO metal features include a line portion and an OPD contact portion formed by an opening in the bank layer, which is described in further detail below with respect to the cross-sectional view of FIG. 8B.

Figure 8B:
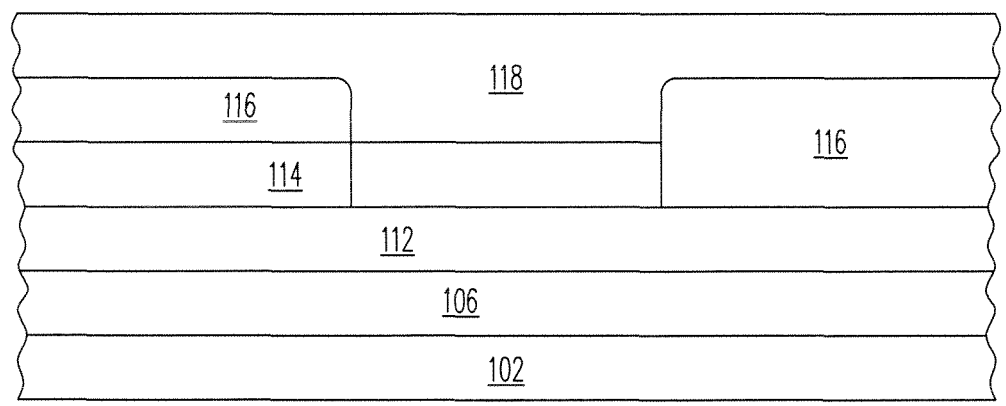

FIG. 8B is the cross-sectional view of the test structure for measuring TM to OPD contact resistance. Shown in FIG. 8B is the substrate 102, gate insulating layer 106, ILD layer 112, and terminating TM/ITO layer 114. The bank layer 116 is shown with an opening so that the OPD layer 118 can contact the TM/ITO layer 114. As previously described, a resistive circuit is completed using each of the paired metal features shown in FIG. 8A. That is, the resistive path is orthogonal to the cross-sectional view of FIG. 8B through the OPD layer 118.

Figure 9A:
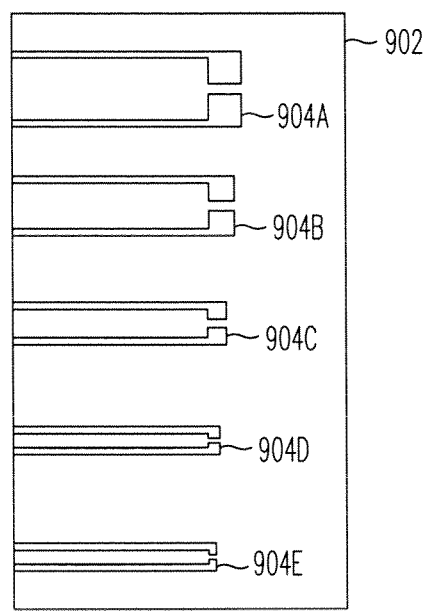

FIG. 9A is the plan view of the test structure for measuring TM to cathode contact resistance. Feature 902 is the cathode layer, and metal features 904A, 904B, 904C, 904D, and 904E are substantially the same as shown in FIG. 8A.

Figure 9B:
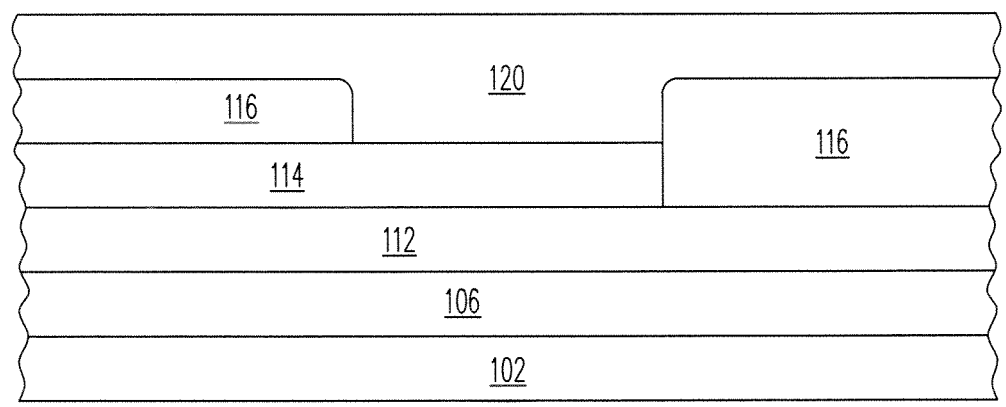

FIG. 9B is the cross-sectional view of the test structure for measuring TM to cathode contact resistance. This figure is substantially the same as FIG. 8B, but it is important to note that the topmost layer is cathode layer 120, and not the OPD layer previously described.

Step coverage of cathode or OPD layers over the bank layer is shown in FIGS. 10A and 10B, and FIGS. 11A and 11B.

Figure 10A:
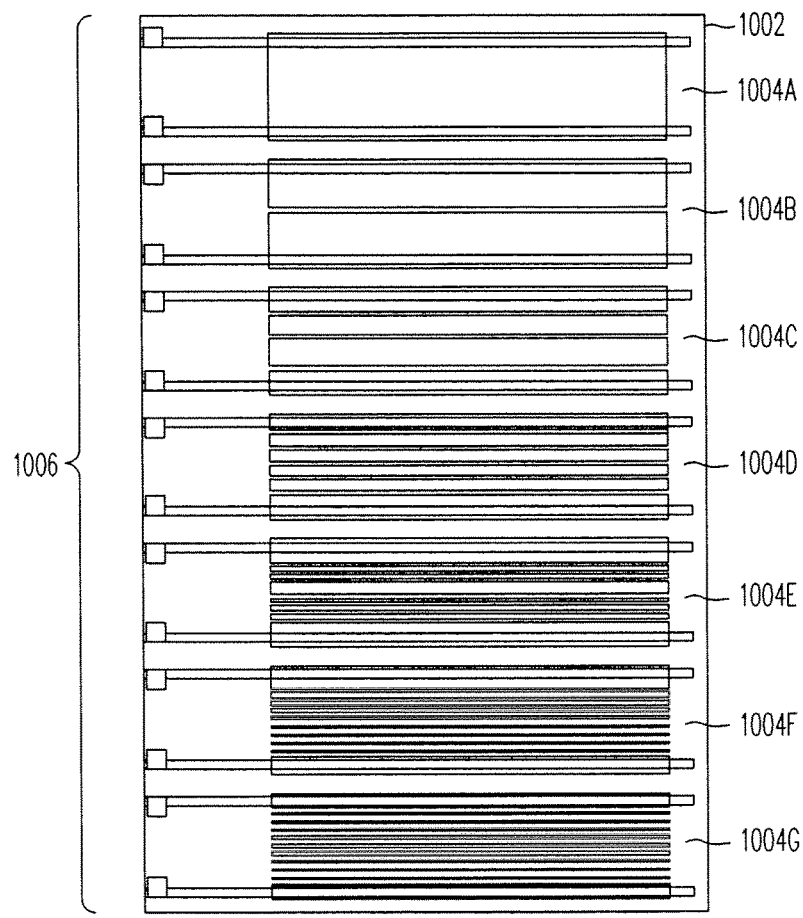
FIGS. 10A, 10B, 11A, and 11B illustrate, in plan and cross-sectional views, step coverage test structures according to the present invention.

Referring now to FIG. 10A, a plan view of the step coverage test structure for the cathode layer is shown. The only features shown in FIG. 10A are the cathode layer 1002, and metal features/bank opening 1004A, 1004B, 1004C, 1004D, 1004E, 1004F, and 1004G, as well as test pads 1006.

In FIG. 10A resistance is being measured between the two coupled test pads 1006, which are connected by a top cathode layer as will be explained in further detail below. There is a plurality of bank holes between the two outermost TM/ITO lines coupled to the test pads. According to the present invention, the step coverage of the cathode layer is tested as it goes over these bank holes. If there is a break in the cathode due to poor step coverage, a high resistance measurement will be found. If there is no breakage, a low resistance measurement will be found.

In FIG. 10A, feature 1004A indicates that there are no steps (or bumps or holes) between the two outermost TM/ITO metal features. This structure will give the reference resistance value (essentially a short circuit with a very low resistance value). Feature 1004B indicates one bank step, feature 1004C indicates three bank steps, feature 1004D indicates five bank steps, feature 1004E indicates seven bank steps, feature 1004F indicates nine bank steps, and feature 1004G indicates ten bank steps.

Figure 10B:
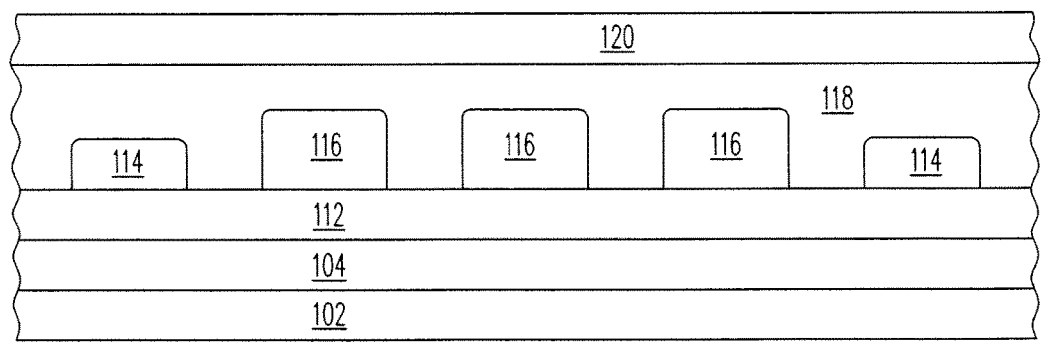

A cross-sectional view of an intermediate test structure, such the one associated with feature 1004C is shown in FIG. 10B. The test structure cross-section includes substrate layer 102, gate insulator layer 104, ILD layer 112, segmented TM/ITO layer 114, and segmented bank layer 116 including three bank steps. An OPD layer 118 and cathode layer 120 cover the segmented bank layer 116.

Figure 11A:
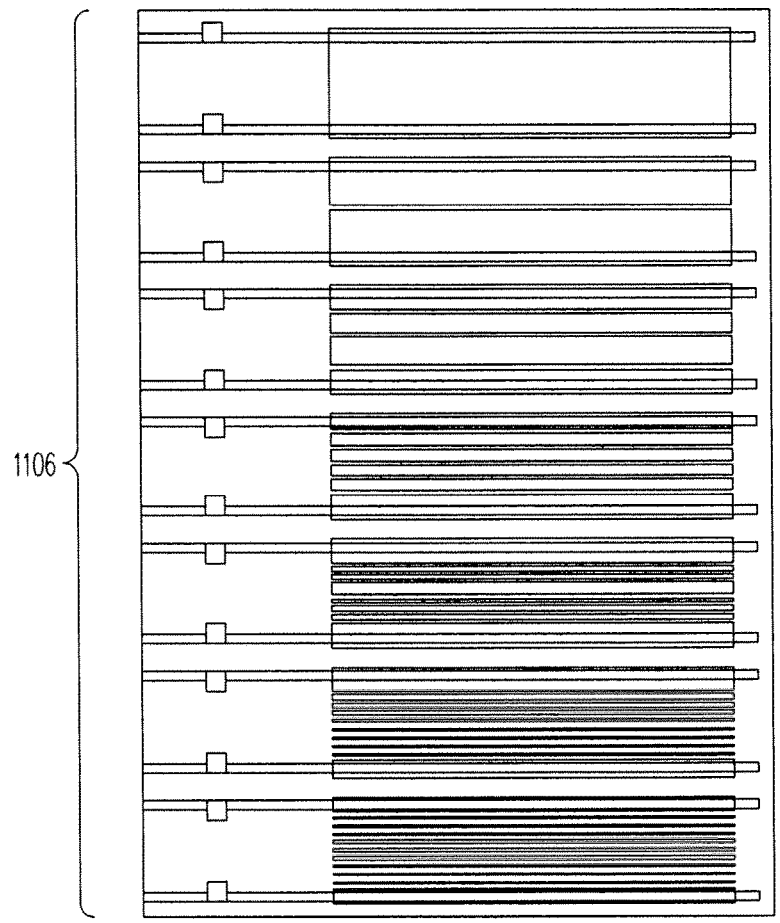

FIG. 11A is a plan view that is substantially the same as the plan view of FIG. 10A. The only difference is that FIG. 11A shows an OPD layer 1102 instead of an OPD/cathode layer 1002. Also shown in FIG. 11A are metal features/bank opening 1104A, 1104B, 1104C, 1104D, 1104E, 1104F, and 1104G, substantially as shown in FIG. 10A. Contact pads 1106 are substantially the same as shown in FIG. 10A.

Figure 11B:
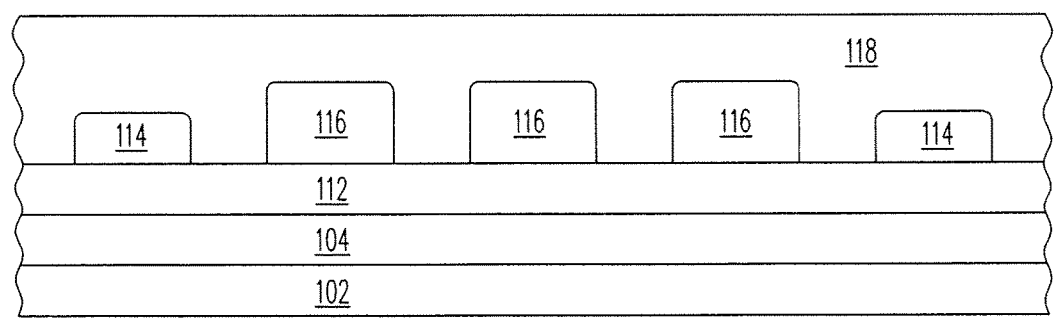

The cross-sectional diagram of FIG. 11B is essentially the same as shown in FIG. 10B. Note, however, that the topmost layer is OPD layer 118, and no cathode layer is present in this test structure.

These designs comprised of top metal and various amounts of organic dielectric material lines under a cathode or OPD layer are used as a means to find the step coverage. Step coverage is a ratio of the thickness of a layer along the wall of a step compared to the thickness of the layer at the bottom of the step. The step coverage is good when the layer has consistent thickness throughout the step. If the step coverage is poor, the resistance can increase in the device. In extreme cases of poor step coverage, an open circuit may be detected.

As seen in FIGS. 10A, 10B, 11A, and 11B, the step coverage is measured between sets of two top metal lines. Then an organic dielectric material line is layered between the two top metal lines, increasing in the number of lines and decreasing in the distance between the dielectric with each set of top metal lines. The differing amount of dielectric lines and distance between them is to find how the step coverage is affected with smaller step widths. The two top metal lines are charged by two gate metal lines connecting to them.

Figure 12A:
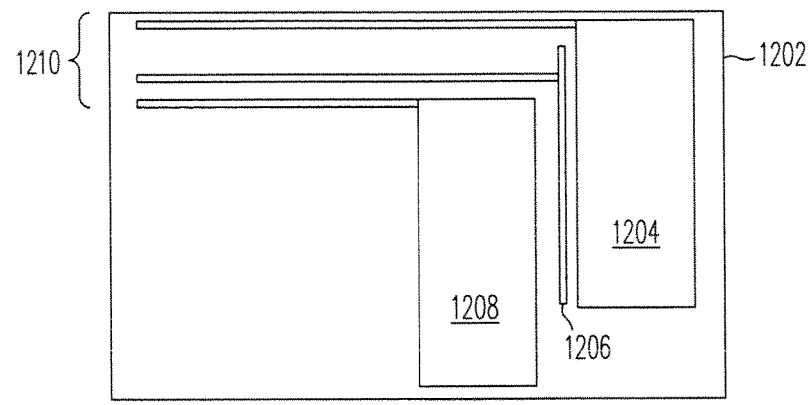
FIGS. 12A and 12B illustrate, in plan and cross-sectional views, a quantum efficiency test structure according to the present invention.
Figure 12B:
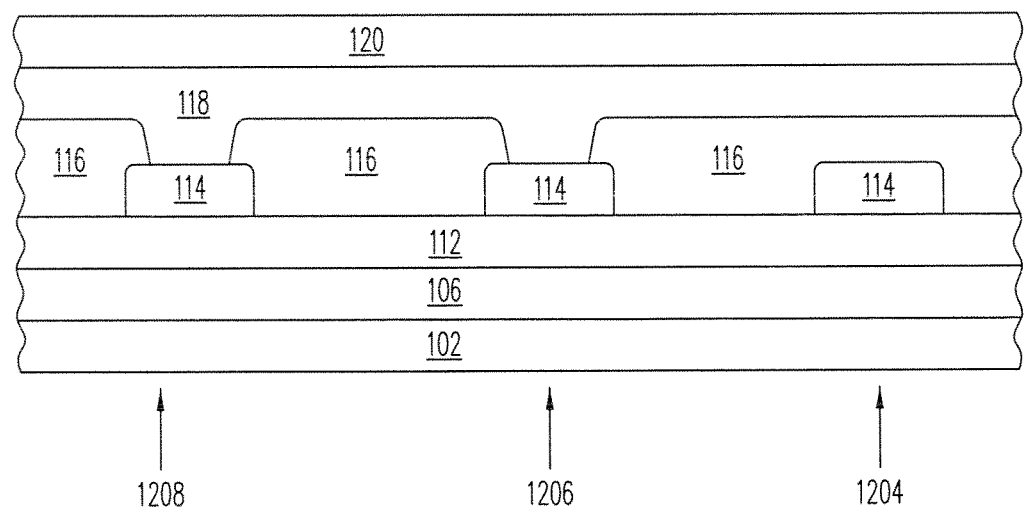

A quantum efficiency test structure is shown in FIGS. 12A and 12B, which measures the effeciency that impingement light is converted into charge that can be used as data provided by the image sensor photodiodes.

Structure 1208 is associated with a reference capacitor, structure 1204 is associated with the photodiode capacitance, and structure 1206 is the TM lead connecting to the cathode to provide the bias. All three structures are contacted through leads 1210. Layer 1202 is the cathode layer.

The test structure is better understood through the cross-sectional view of FIG. 12B, which includes identification numerals 1204, 1206, and 1208 associated with FIG. 12A. Test structure includes substrate layer 102, gate insulating layer 106, ILD layer 112, segmented TM/ITO layer 114, and segmented bank layer 116. A continuous OPD layer 118 and a continuous cathode layer 120 are formed over the segmented bank layer 116 100781 The structures shown in FIGS. 12A and 12B include two top metal rectangles under a cathode, and measure the quantum efficiency (Q.E.) of a device. The Q.E. essentially describes how well the device can produce an image. A higher quantum efficiency improves the device's ability to detect small objects and also reduces radiation dose of the device.

Figure 13A:
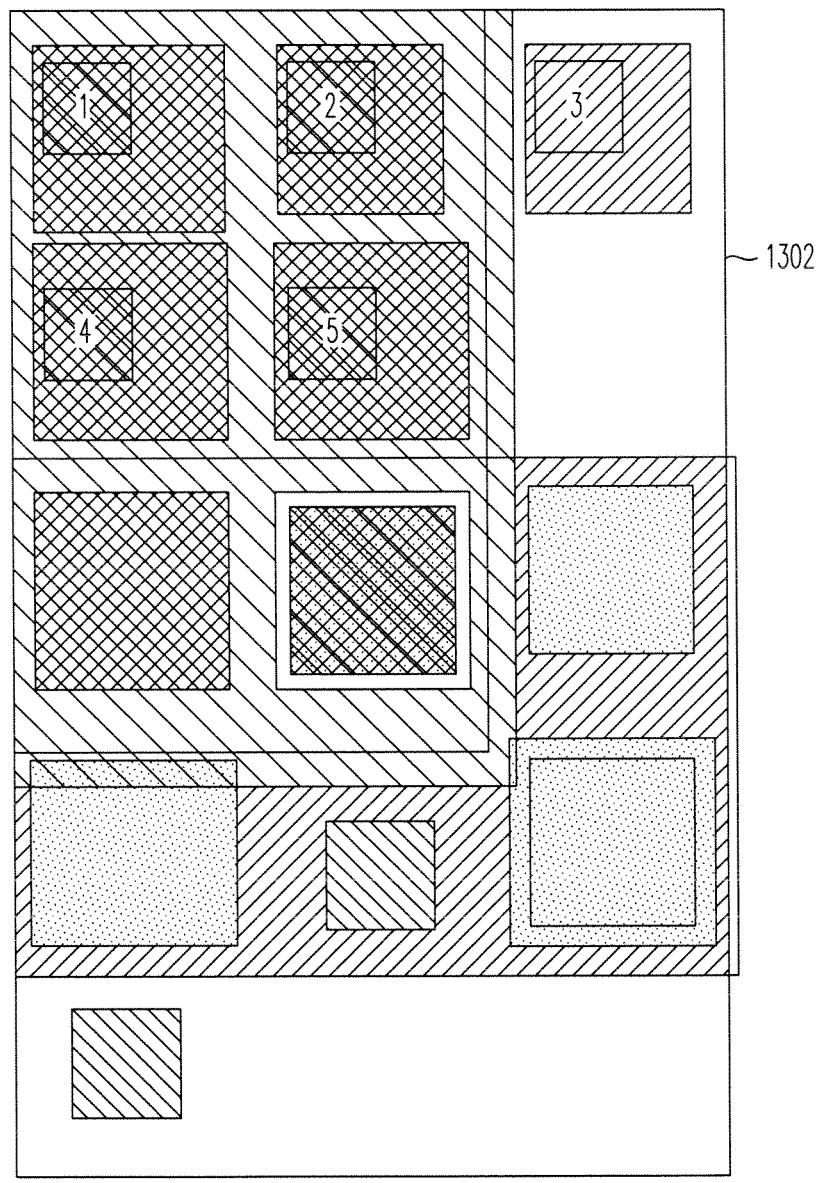

A film adhesion tape test structure 1302 is shown in plan view in FIG. 13A. The film adhesion tape test structure 1302 uses different sizes of overlapping image sensor layer features using, for example, a square, rectangular, or slit shape. Test structure 1302 is shown in FIG. 13A only to show a general visual representation of what the test structure would look like in a "test chip" or embedded in a sensor array.

Figure 13B:
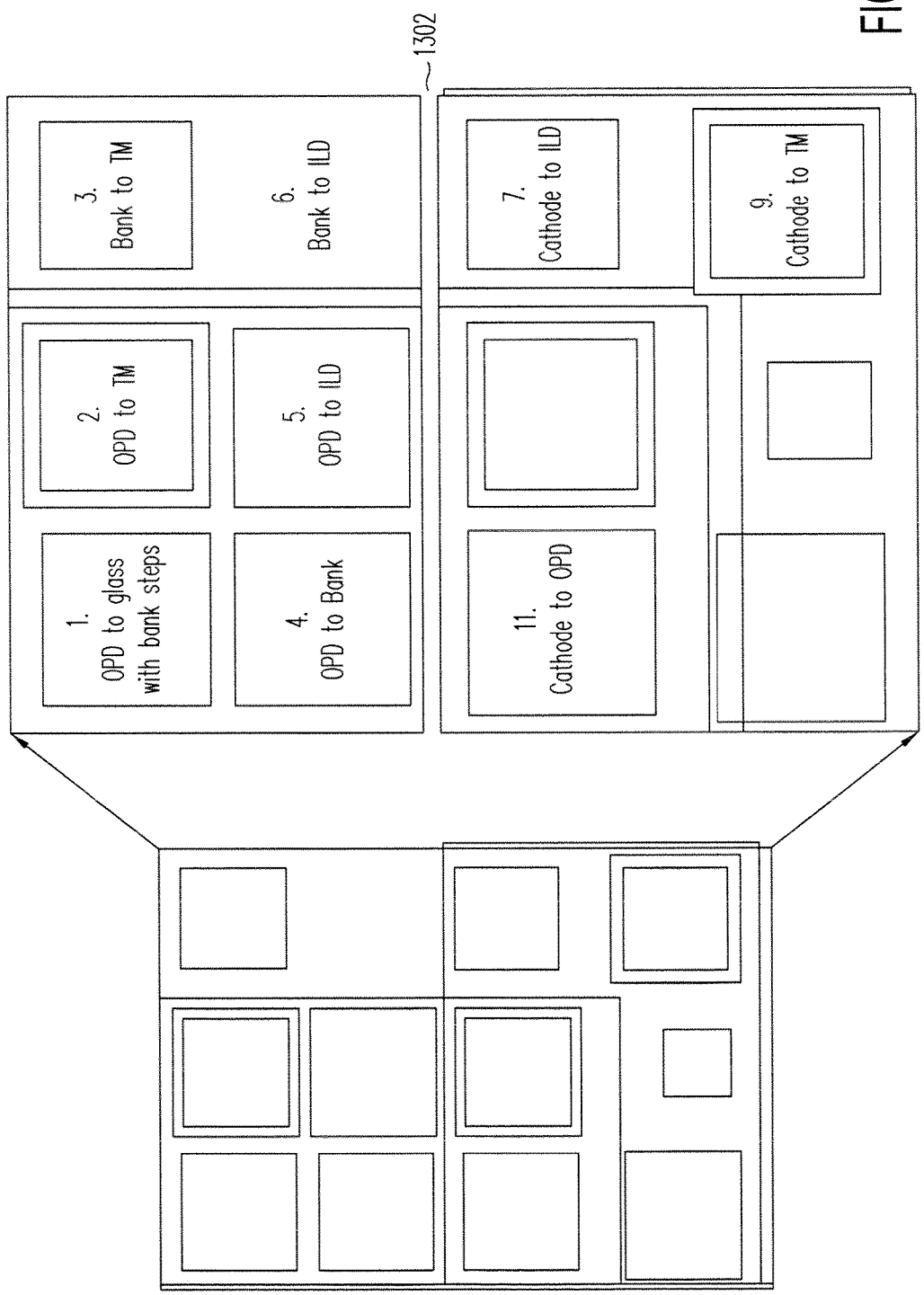

The test structure 1302 is shown in slightly better detail in the plan view of FIG. 13B. In particular, sections of test structure 1302 are labeled to indicate which overlapping layers are found in this section of the test structure, as is described in further detail below.

Section 1 comprises an OPD layer to Glass overlap section, with additional bank opening steps and is described in further detail below.

Section 2 comprises an OPD layer to TM layer overlap section, and is described in further detail below.

Section 3 comprises a Bank layer to TM layer overlap section, as is described in further detail below.

Section 4 comprises an OPD layer to Bank layer overlap section, as is described in further detail below.

Section 5 comprises an OPD layer to ILD layer overlap section, as is described in further detail below.

Section 6 comprises a Bank layer to ILD layer overlap section, as is described in further detail below.

Section 7 comprises a Cathode layer to ILD layer overlap section, as is described in further detail below.

Section 9 comprises a Cathode layer to TM layer overlap section, as is described in further detail below.

Section 11 comprises a Cathode layer to OPD layer overlap section, as is described in further detail below.

Omitted sections in FIG. 13B represent overlapping sections that do not actually occur in the image sensor device represented in FIG. 1, and thus are not discussed in any detail.

Test structure 1302 is made up of several different layered boxes, and is used for a mask adhesion tape test. For this test, a small piece of pressure sensitive adhesive tape is placed across the surface of the area that is being tested. The tape is then removed rapidly less than a minute after it is applied to the area. The tape and the surface of the testing area are then closely examined to see if any of the material tested was removed by the tape. The test examines how well certain materials connect with other materials to improve the design of the image sensor device.

Figure 13C:
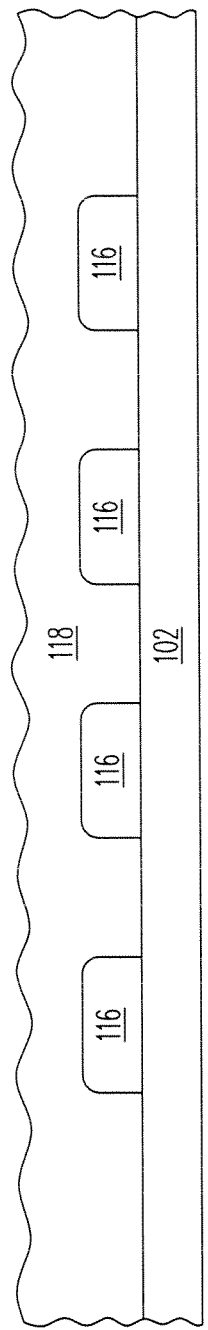

Section 1 is shown in a cross-sectional view in FIG. 13C. Substrate 102 is shown, as well as bank steps 116, and an OPD layer 118.

Figure 13D:
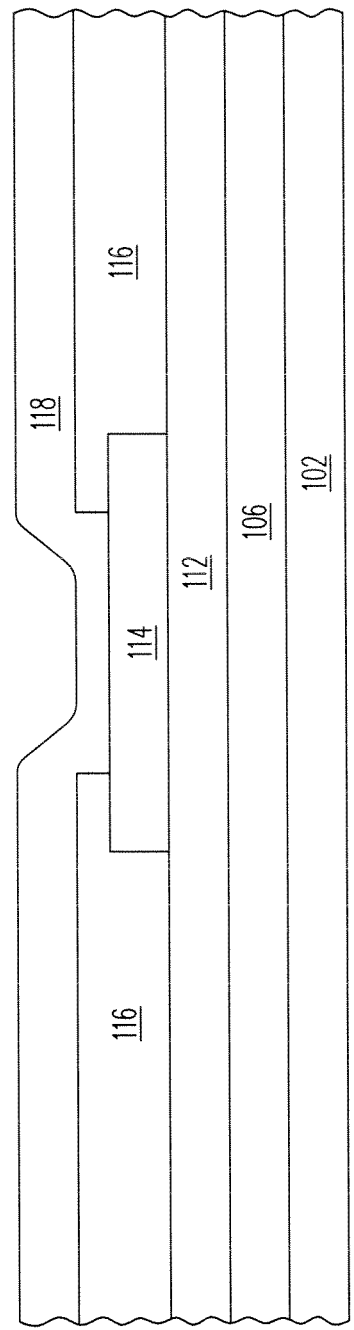

Section 2 is shown in a cross-sectional view in FIG. 13D. Substrate 102 is shown, as well as gate insulating layer 106, ILD layer 112, TM/ITO layer 114, segmented bank layer 116, and OPD layer 118.

Figure 13E:
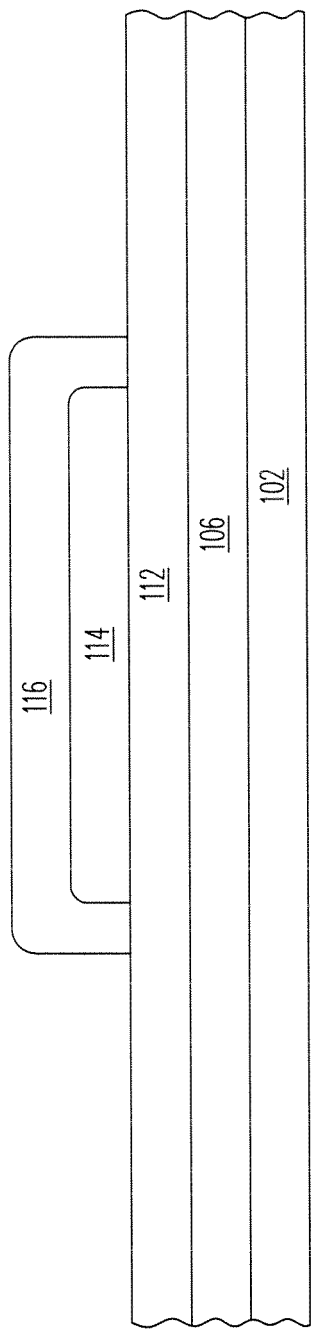

Section 3 is shown in a cross-sectional view in FIG. 13E. Substrate 102 is shown, as well as gate insulating layer 106, ILD layer 112, TM/ITO layer 114, and bank layer 116.

Figure 13F:
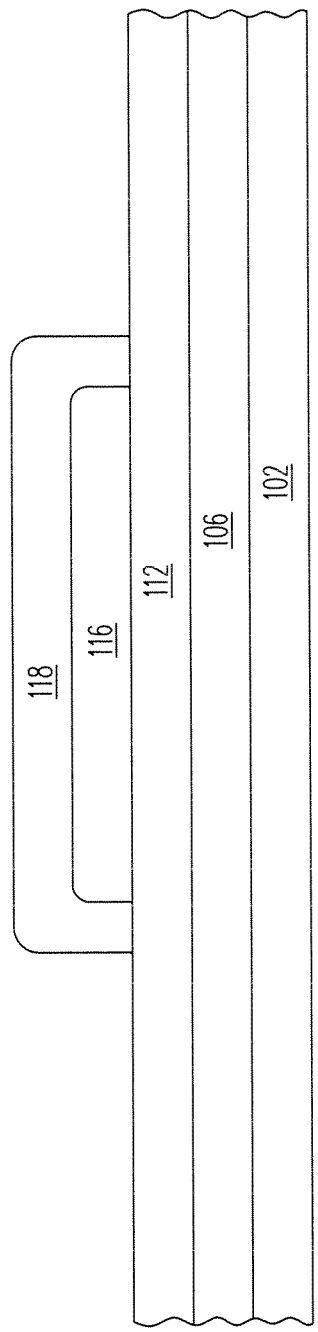

Section 4 is shown in a cross-sectional view in FIG. 13F. Substrate 102 is shown, as well as gate insulating layer 106, ILD layer 112. hank layer 116, and OPD layer 118.

Section 5 is shown in a cross-sectional view in FIG. 13G. Substrate 102 is shown, as well as gate insulating layer 106, ILD layer 112, segmented bank layer 116, and OPD layer 118.

Section 6 is shown in a cross-sectional view in FIG. 13H. Substrate 102 is shown, as well as gate insulating layer 106, ILD layer 112, and bank layer 116.

Figure 13I:
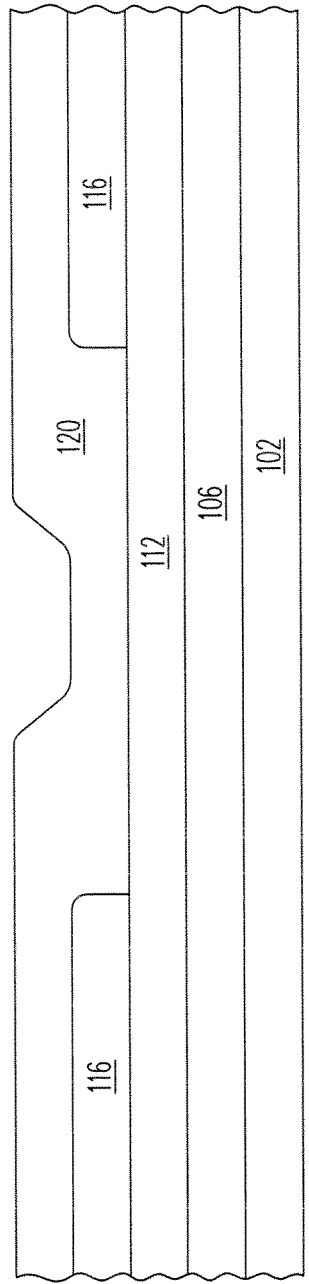

Section 7 is shown in a cross-sectional view in FIG. 13I. Substrate 102 is shown, as well as gate insulating layer 106, ILD layer 112, segmented bank layer 116, and cathode layer 120.

Figure 13J:
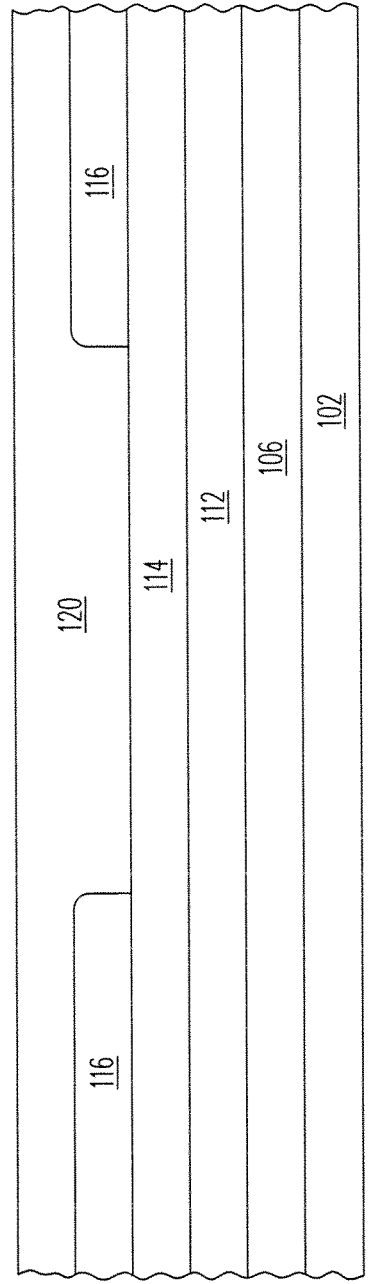

Section 9 is shown in a cross-sectional view in FIG. 13J. Substrate 102 is shown, as well as gate insulating layer 106, ILD layer 112, TM/ITO layer 114, segmented bank layer 116, and cathode layer 120.

Figure 13K:
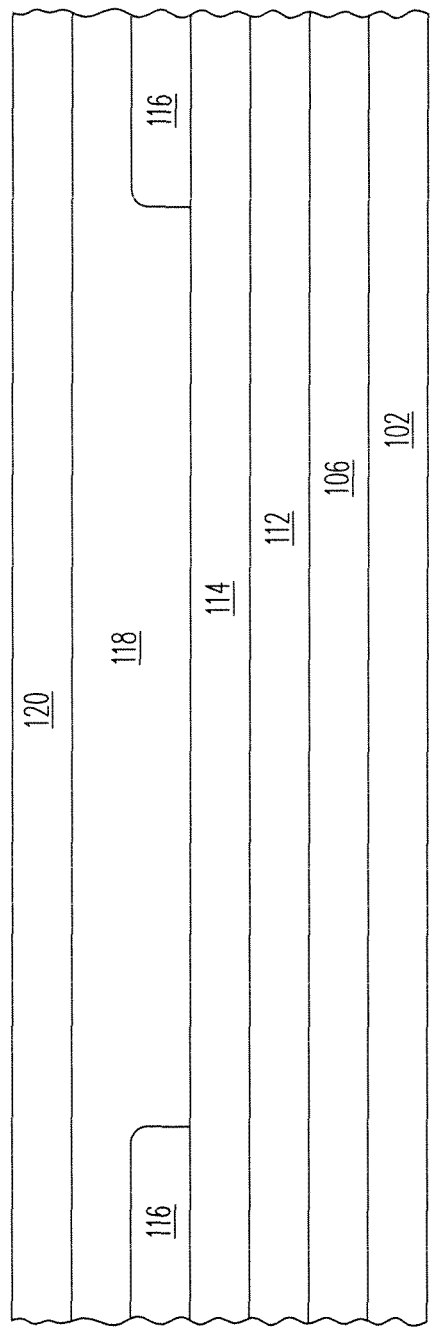

Section 11 is shown in a cross-sectional view in FIG. 13K. Substrate 102 is Shown, as well as gate insulating layer 106. ILD layer 112. TM/ITO layer 114, segmented bank layer 116. OPD layer 118. and cathode layer 120.

Figure 14:
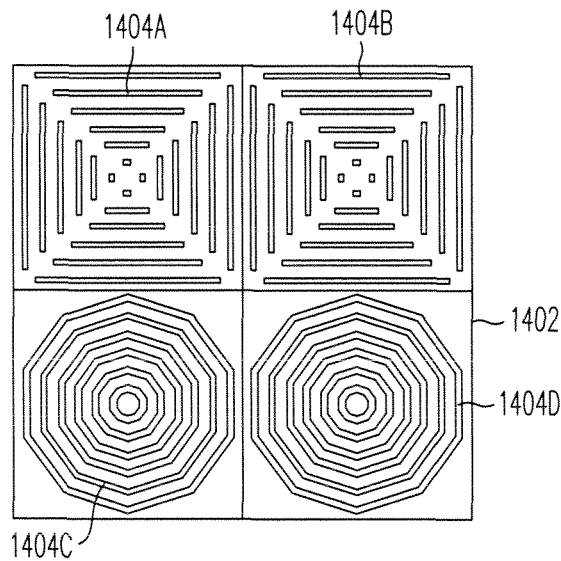
FIGS. 14-16 illustrate, in plan views, inkjet printing test structures according to the present invention.

An inkjet printing test structure 1402 is shown in plan view in FIG. 14. The inkjet printing test structure shown in FIG. 14 includes portions 1404A, 1404B, 1404C, and 1404D. A continuous TM layer is deposited over a segmented gate metal layer, as shown, which are both printed onto a glass or other substrate, which is not shown in FIG. 14. The test structure 1402 of FIG. 14 is used to measure how the OPD layer (described in further detail below) is patterned on different geometries and to check uniformity, and to also give some measure of viscosity. The inkjet test structure is purely for visual inspection. Test structure 1402 is used to indicate how different OPD layers behave and sit on different patterns. There are multiple samples of each design to inspect out uniformity.

Figure 15:
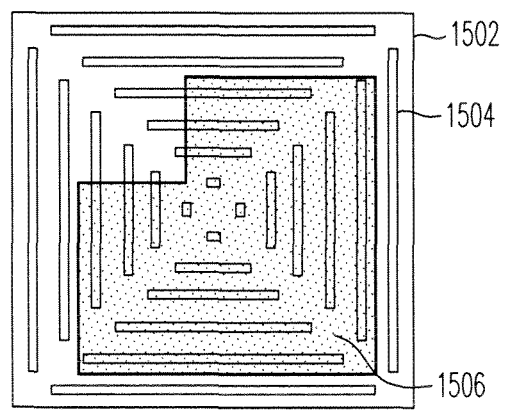

In FIG. 15 the same inkjet test structure of FIG. 14 is shown, however layer 1502 represents an additional bank layer over the segmented gate layer 1504, and the TM later is exposed through a bank layer hole 1506. An OPD layer, not shown, can then be applied over the test structure of FIG. 15. The OPD layer can then be visually inspected to determine how much it moves from a desired shape.

Figure 16:
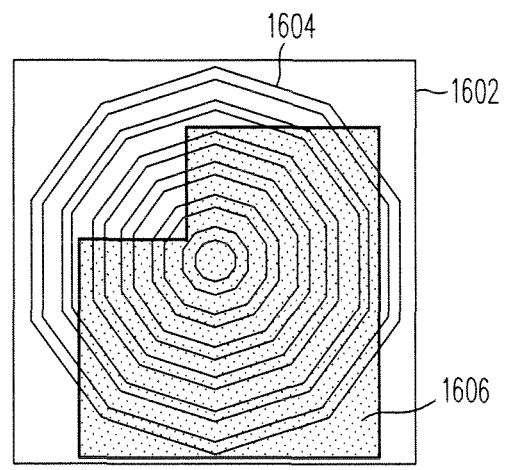

A similar inkjet test structure is shown in FIG. 16, but including a different gate layer pattern. Layers 1602, 1604, and 1606 correspond to the same layers described above with respect to FIG. 15.

The inkjet test structures shown in FIGS. 14-16 can also be used for measuring the accuracy of ink drop positions, wettability, and the volume of the ink drop.

A representative individual test chip 1700 is shown in FIG. 17, showing various individual test structure locations 1702. While a suggested layout is shown in FIG. 17, it will be understood by those skilled in the art that other such layouts can be used.

A first embodiment of a test chip is shown in FIG. 18, including a glass substrate 1800, a plurality of OPD test chips 1802, and a plurality of image sensor arrays 1804. The arrangement of the test chips and arrays are shown in a regular pattern and one-to-one correspondence, but other layouts can also be used.

A second embodiment of a test chip is shown in FIG. 19, including a glass substrate 1900, and a plurality of individual OPD test chips 1902. A regular pattern of test chips is shown, but other such layouts can also be used.

It is an advantage of the present invention that, upon validation of design parameters using the previously described test structures, low cost medical imaging panels can be produced. The same technology can also be made compatible for flexible panel manufacturing by using, for example, flexible substrates.

It is a further advantage of the present invention that the previously described test structures and the corresponding data help to compare the performance of OPD photodiodes with the performance of amorphous silicon photodiodes which further helps to improve the process and design of image arrays for medical applications.

In summary, test structures for the electrical, optical, and process characteristics of an OPD device and the materials of an OPD device have been shown and described.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A test structure for characterizing an organic photodiode ("OPD") image sensor comprising:
    on a common substrate, an OPD sheet resistance portion and at least one of:
        a cathode sheet resistance portion;
        a diode capacitance portion;
        a contact resistance portion;
        a step coverage portion;
        a quantum efficiency portion:
        a film adhesion portion; and an inkjet printing portion, wherein the OPD sheet resistance portion comprises:

a plurality of gate metal sets, each gate metal set including four evenly spaced metal lines terminating in a probe point, wherein the spacing within each gate metal set is progressively increased from a first gate metal set to a last gate metal set, and wherein a spacing between each gate metal set is larger than the spacing within any gate metal set; and an OPD sheet formed over the plurality of gate metal sets.

2. The test structure of claim 1 wherein the cathode sheet resistance portion comprises:

a plurality of gate metal sets, each gate metal including four evenly spaced metal lines terminating in a probe point, and wherein the spacing for each gate metal set is progressively increased from a first gate metal set to a last gate metal set; and a cathode sheet formed over the plurality of gate metal sets.

3. The test structure of claim 1 wherein the diode capacitance portion comprises:

a bottom electrode coupled to a probe point;

an OPD layer over the bottom electrode; and a top electrode coupled to a probe point.

4. The test structure of claim 1 wherein the contact resistance portion comprises a plurality of paired sub-test structures having a plurality of different bank layer openings for measuring OPD layer coverage therein.

5. The test structure of claim 1 wherein the contact resistance portion comprises a plurality of paired sub-test structures having a plurality of different bank layer openings for measuring cathode layer coverage therein.

6. The test structure of claim 1 wherein the step coverage portion comprises a segmented top metal layer and a segmented bank layer, covered with a continuous OPD layer and a continuous cathode layer.

7. The test structure of claim 1 wherein the step coverage portion comprises a segmented top metal layer and a segmented bank layer, covered with a continuous OPD layer.

8. The test structure of claim 1 wherein the quantum efficiency portion comprises a reference capacitor portion and an OPD photodiode portion.

9. The test structure of claim 1 wherein the film adhesion portion comprises a plurality of overlapping image sensor layers.

10. The test structure of claim 9 wherein the film adhesion portion comprises an OPD layer to glass substrate adhesion portion.

11. The test structure of claim 9 wherein the film adhesion portion comprises an OPD layer to top metal layer adhesion portion.

12. The test structure of claim 9 wherein the film adhesion portion comprises a bank layer to top metal layer adhesion portion.

13. The test structure of claim 9 wherein the film adhesion portion comprises an OPD layer to bank layer adhesion portion.

14. The test structure of claim 9 wherein the film adhesion portion comprises an OPD layer to ILD layer adhesion portion.

15. The test structure of claim 9 wherein the film adhesion portion comprises a bank layer to ILD layer adhesion portion.

16. The test structure of claim 9 wherein the film adhesion portion comprises a cathode layer to ILD layer adhesion portion.

17. The test structure of claim 9 wherein the film adhesion portion comprises a cathode layer to top metal layer adhesion portion.

18. The test structure of claim 9 wherein the film adhesion portion comprises a cathode layer to OPD layer adhesion portion.

19. The test structure of claim 1 wherein the inkjet printing portion comprises a continuous top metal layer over a segmented gate metal layer.

20. The test structure of claim 1 wherein the test structure is integrated on the common substrate as a standalone test structure.

21. The test structure of claim 1 wherein the test structure is integrated on the common substrate with a photodiode array.

22. The test structure of claim 1 wherein the substrate comprises a glass substrate.

23. The test structure of claim 1 wherein the substrate comprises a flexible substrate.

* * * * *